United States Patent
Matsuoka (10) Patent No.: US 11,160,201 B2
(45) Date of Patent: Oct. 26, 2021

(54) COMPONENT MOUNTING SYSTEM AND COMPONENT DATA CREATION METHOD

(71) Applicant: Panasonic Intellectual Property Management Co., Ltd., Osaka (JP)

(72) Inventor: Hideo Matsuoka, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1427 days.

(21) Appl. No.: 14/736,817

(22) Filed: Jun. 11, 2015

(65) Prior Publication Data

US 2015/0373885 A1 Dec. 24, 2015

(30) Foreign Application Priority Data

Jun. 24, 2014 (JP) .............................. JP2014-128750

(51) Int. Cl.
*H05K 13/08* (2006.01)

(52) U.S. Cl.
CPC .... *H05K 13/0882* (2018.08); *Y10T 29/53174* (2015.01)

(58) Field of Classification Search
CPC .................... H05K 13/08; Y10T 29/53174
USPC ......................................................... 700/121
See application file for complete search history.

(56) References Cited

U.S. PATENT DOCUMENTS

| 6,002,650 A | 12/1999 | Kuribayashi et al. |
| 6,480,751 B1 | 11/2002 | Kuribayashi et al. |
| 8,849,442 B2 * | 9/2014 | Ishimoto ............... H05K 13/08 29/832 |
| 2007/0250201 A1 * | 10/2007 | Elhanan ........... G05B 19/41865 700/121 |

(Continued)

FOREIGN PATENT DOCUMENTS

| CN | 1243657 A | 2/2000 |
| CN | 102293076 A | 12/2011 |
| JP | H06-125196 A | 5/1994 |

(Continued)

OTHER PUBLICATIONS

English Translation of Chinese Search Report dated Nov. 19, 2018 for the related Chinese Patent Application No. 201510354492.9.

*Primary Examiner* — Rocio Del Mar Perez-Velez
*Assistant Examiner* — Christopher W Carter
(74) *Attorney, Agent, or Firm* — Pearne & Gordon LLP (57) ABSTRACT

A component mounting system includes a component mounting apparatus, a data creating apparatus and a component arranging operation supporting apparatus. The component mounting apparatus mounts components on a substrate. The data creating apparatus creates component data for each component. The component arranging operation supporting apparatus includes an identification information acquiring unit that acquires component identification information given to the component supplying member, and a control unit which checks a component to be disposed in a position based on the component identification information.

(Continued)

The control unit of the component arranging operation supporting apparatus performs a request for a creation of component data regarding an alternative component, and the data creating apparatus receives the request and creates the component data regarding the alternative component.

2 Claims, 5 Drawing Sheets

(56) References Cited

U.S. PATENT DOCUMENTS

2012/0004759 A1  1/2012  Ishimoto

FOREIGN PATENT DOCUMENTS

| JP | 2002-094299 A | 3/2002 |
| JP | 2002-512733 A | 4/2008 |
| JP | 2010-177291 A | 8/2010 |

* cited by examiner

COMPONENT MOUNTING SYSTEM AND COMPONENT DATA CREATION METHOD

CROSS REFERENCE TO RELATED APPLICATIONS

This application is based upon and claims the benefit of priority of Japanese Patent Application No. 2014-128750 filed on Jun. 24, 2014, the contents of which are incorporated herein by reference in its entirety.

BACKGROUND OF THE INVENTION

1. Field of the Invention

The present invention relates to a component mounting system that mounts a component on a substrate, and a component data creation method.

2. Description of the Related Art

In the field of mounting electronic components, a method in which a plurality of mounting lines provided with a plurality of component mounting apparatuses that mounts components on substrates is arranged and in which the substrates are produced in each mounting line has been adopted. The component mounting apparatus that picks up components supplied from a plurality of tape feeders arranged in a component supplying unit by using a mounting head and mounts the picked-up components on the substrate has been known. The mounting head is controlled based on component data as a control parameter which is created for each component.

At a production site, multiple types of components which have the same electrical characteristics and are manufactured by different component manufacturers are used in some cases due to reasons such as convenience of the component supply. As the type of the component which is used, there are a master component that is preferentially used as a mounting target and an alternative component that is used when the master component is not in stock. In the related art, a component supplying method using these components has been suggested (for example, see Japanese Patent No. 3509107).

In the example illustrated in Japanese Patent No. 3509107, component arrangement data obtained by combining the master component and the alternative component that can be commonly arranged in the respective positions of the component supplying unit is created. When the alternative component is arranged in the component supplying unit instead of the master component, a detection unit detects the alternative component supplied from the tape feeder, and it is determined that the alternative component is a correct alternative component by comparing the component arrangement data. When the alternative component is the correct alternative component, a mounting head mounts the alternative component on the substrate based on the component data regarding the alternative component.

SUMMARY OF THE INVENTION

At the production site, the same type of alternative components supplied from the same manufacturer are not always prepared, and an alternative component of which component data has not been created needs to be used in some cases. When the master component is not in stock in a certain mounting line, the alternative component of which component data has not been created is brought from another mounting line, and the brought alternative component is used in this mounting line due to urgency in some cases. However, in the related art, in order to use such an alternative component in the production, an operator needs to manually create component data for the alternative component, and the operation of the apparatus needs to be stopped during the data creation. In such related art, when the alternative component of which component data has not been previously created is used due to urgency, it is difficult to rapidly cope with such a situation at the production site.

A non-limited object of the present invention is to provide a component mounting system and a component data creation method capable of rapidly and simply creating component data regarding an alternative component at a production site.

A first aspect of the present invention provides a component mounting system including: a component mounting apparatus which mounts components supplied from a component supply member disposed in a component supplying unit on a substrate; a data creating apparatus which creates component data, which is a control parameter set for mounting the component on the substrate by the component mounting apparatus, for each component; and a component arranging operation supporting apparatus which includes an identification information acquiring unit that acquires component identification information given to the component supplying member, and a control unit which checks whether or not the component disposed in a predetermined position in the component supplying unit is a component to be disposed in the predetermined position based on the component identification information acquired by the identification information acquiring unit, wherein the control unit of the component arranging operation supporting apparatus includes a component data creation requesting unit that transmits the component identification information acquired by the identification information acquiring unit and identification information related to an alternative component that is used as an alternative to the component to the data creating apparatus and performs a request for a creation of component data regarding the alternative component, and the data creating apparatus receives the request from the component data creation requesting unit and creates the component data regarding the alternative component.

A second aspect of the present invention provides a component data creation method of a component mounting system that includes a component mounting apparatus which mounts components supplied from a component supply member disposed in a component supplying unit on a substrate, a data creating apparatus which creates component data, which is a control parameter set for mounting the component on the substrate by the component mounting apparatus, for each component, and a component arranging operation supporting apparatus which includes an identification information acquiring unit that acquires component identification information given to the component supplying member and a control unit that checks whether or not the component disposed in a predetermined position in the component supplying unit is a component to be disposed in the predetermined position based on the component identification information acquired by the identification information acquiring unit, the method including: causing the identification information acquiring unit to acquire identification information related to the component and identification information related to an alternative component that is used as an alternative to the component; causing the component arranging operation supporting apparatus to transmit both of the identification information related to the component and the alternative component acquired by the identification information acquiring unit to the data creating apparatus;

and causing the data creating apparatus to create component data regarding the alternative component based on both of the identification information related to the component and the alternative component received from the component arranging operation supporting apparatus.

According to any of the aspects of the present invention, it is possible to rapidly and simply create component data regarding an alternative component at a production site.

DETAILED DESCRIPTION OF THE EXEMPLARY EMBODIMENTS

Figure 1:
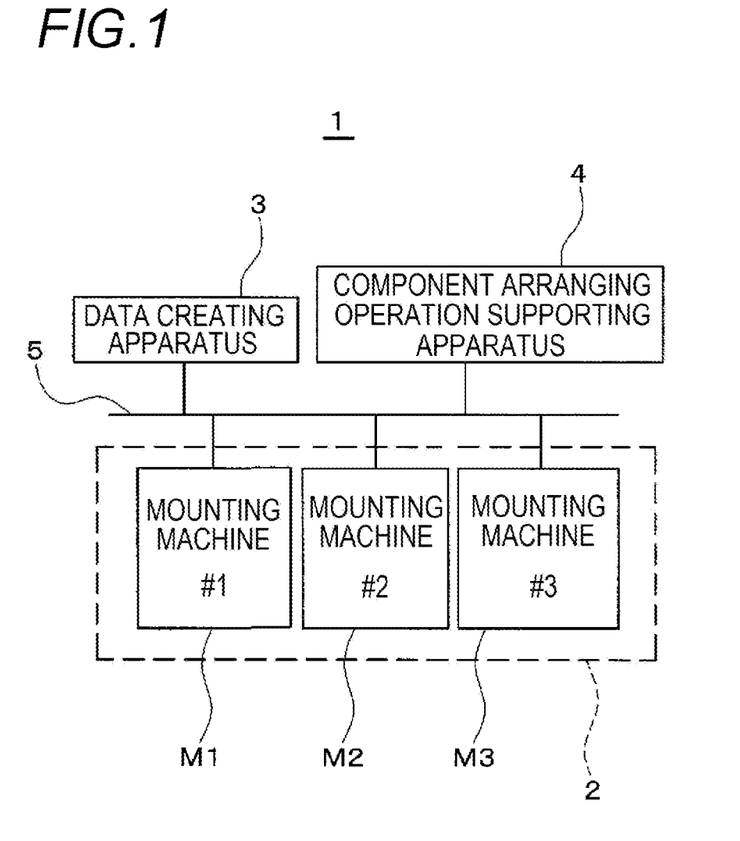
FIG. 1 is a diagram showing the entire configuration of a component mounting system according to an embodiment of the present invention.

First, the entire configuration of a component mounting system according to an embodiment of the present invention will be described with reference to FIG. 1. A component mounting system 1 includes a mounting line 2, a data creating apparatus 3, and a component arranging operation supporting apparatus 4. The mounting line 2 is configured such that a plurality of mounting machines (component mounting apparatuses) M1, M2, and M3 is connected. The data creating apparatus 3, the component arranging operation supporting apparatus 4, and the mounting machines M1 to M3 are connected so as to communicate with each other via a communication network 5. A plurality of mounting lines 2 may be provided.

Figure 2:
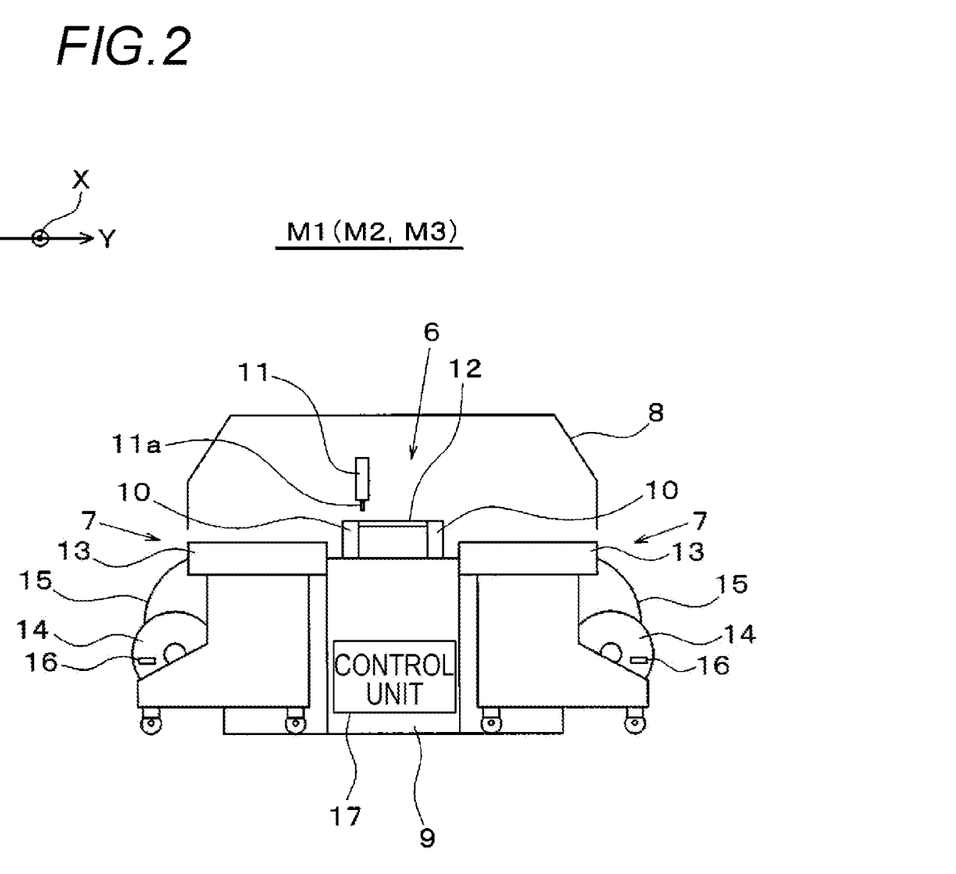
FIG. 2 is a side view of a component mounting apparatus constituting the component mounting system according to the embodiment of the present invention.

In FIG. 2, each of the mounting machines M1 to M3 includes a component mounting unit 6, and component supplying units 7 that are provided on both sides of the component mounting unit 6. The respective units are covered with a cover member 8. In FIG. 2, a direction perpendicular to the sheet is defined as an X direction, and a direction perpendicular to the X direction on a horizontal plane is defined as a Y direction. The component mounting unit 6 includes a substrate transporting mechanism 10 including a pair of transport conveyers which is provided on a base 9 and extends in the X direction, and a mounting head 11 that can move in the X direction and the Y direction above the substrate transporting mechanism 10. The substrate transporting mechanism 10 transports a substrate 12, and positions the substrate 12 in a predetermined mounting operation position. The mounting head 11 includes a suction nozzle 11a that can suction the component, and picks up the component supplied from the component supplying unit 7 and mounts the picked-up component on the substrate 12 by the suction nozzle 11a.

A plurality of tape feeders 13 is arranged in the component supplying unit 7 while being arranged in the X direction. A supply reel 14 which accommodates a carrier tape 15 so as to be wound therearound, which holds a plurality of components, is set to the tape feeder 13. The tape feeder 13 supplies the components up to a component pick-up position by the mounting head 11 by pitch-feeding the carrier tape 15. The supply reel 14 functions as a component supply member that supplies the components held by the carrier tape 15. The mounting machines M1 to M3 pick up the components supplied from the tape feeder 13, and mount the picked-up components on the substrate 12.

A barcode label 16 is provided on a side surface of the supply reel 14. Identification information related to the component held by the carrier tape 15 which is accommodated so as to be wound around the supply reel 14 is recorded on the barcode label 16. The identification information is read by a barcode reader 25 included in the component arranging operation supporting apparatus 4, to be described below. A storage medium that can read information from the outside may be provided in the supply reel 14 instead of the barcode label 16, and the identification information recorded on the storage medium may be read.

Figure 3:
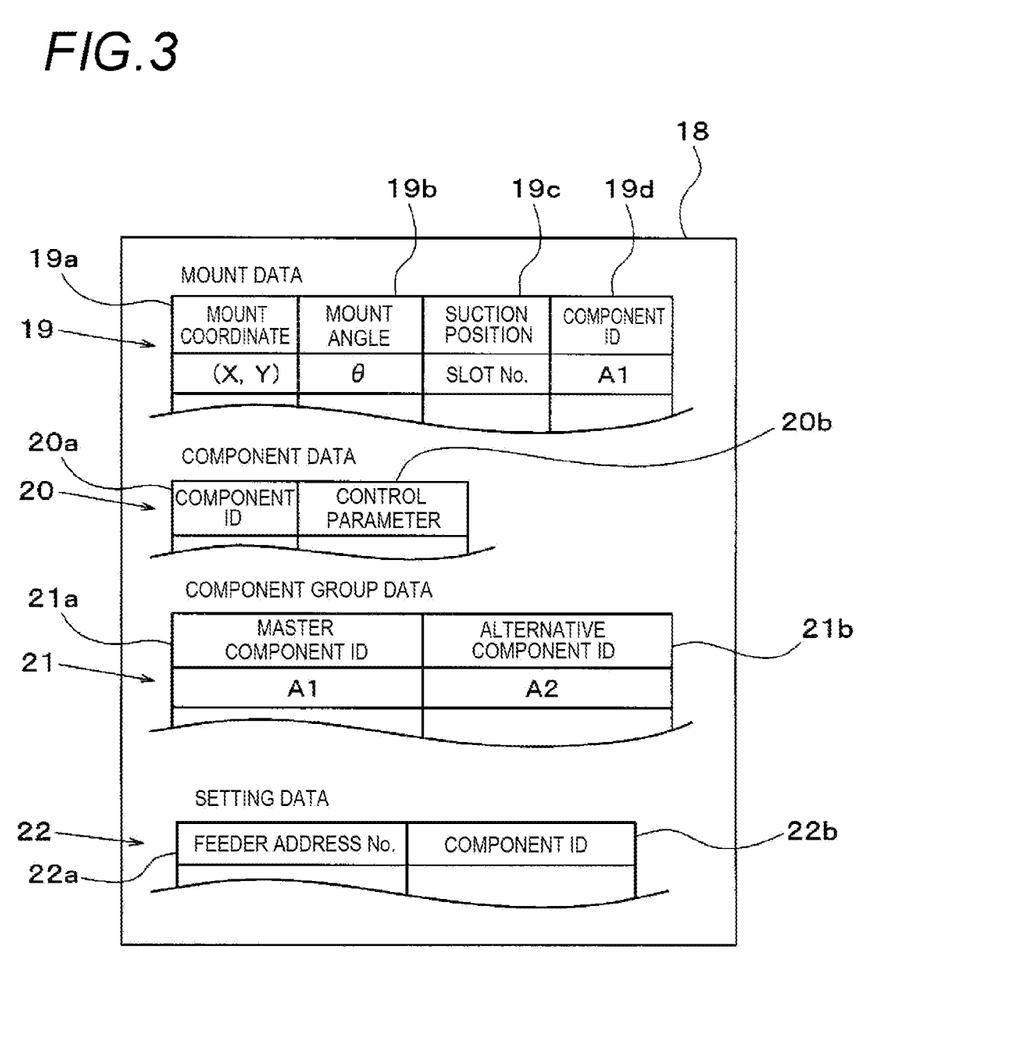
FIG. 3 is a diagram for describing production data stored in the component mounting apparatus constituting the component mounting system according to the embodiment of the present invention.

The respective mechanisms constituting the component mounting unit 6 and the component supplying unit 7 are controlled by a control unit 17 provided in each of the mounting machines M1 to M3. The control unit 17 has a storage region, and production data 18 shown in FIG. 3 is stored in the storage region. The production data 18 includes various data used for producing the substrate 12 on which the component has been mounted, and includes mount data 19, component data 20, component group data 21, and setting data 22.

The mount data 19 is data used for mounting the component on the substrate 12, and includes a "mount coordinate" 19a, a "mount angle" 19b, an "suction position" 19c, and a "component ID" 19d which are associated with each component. The "mount coordinate" 19a indicates an XY coordinate of the mounting position set to the substrate 12. The "mount angle" 19b indicates a mount angle of the component on the horizontal plane. The "suction position" 19c indicates a slot No. of the tape feeder 13 to which the component is supplied. The "component ID" 19d indicates information (identification information) for identifying each component.

The component data 20 is data including various information related to the component, and includes a "control parameter" 20b and a "component ID" 20a which are both pieces of identification information related to each component which are combined with each other. The "control parameter" 20b includes a component size, an acceleration that defines the operation of the suction nozzle 11a, and information related to a switching timing at which a valve connected to the suction nozzle 11a is turned on or off. The control unit 17 controls the operation of the mounting head 11 to pick up the component and to mount the picked-up component on the substrate 12 based on the component data 20. As mentioned above, the component data 20 is used as a control parameter when the component is mounted on the substrate 12 by the mounting machines M1 to M3.

The component group data 21 is data obtained by grouping a master component and an alternative component that can be mounted on a common mounting position, and includes a "master component ID" 21a and an "alternative component ID" 21b which are combined with each other. The master component refers to a primary component provided as a mounting target to be mounted in one mounting position. The alternative component refers to a component that has the same electrical characteristics as those of the master component and can be mounted as an alternative to the master component. In general, the master component is preferentially used at a production site, and the alternative component is used in an emergency situation when the master component is not in stock. In the present specification, a case where the component is simply referred to as the "component" refers to the "master component".

The "master component ID" 21*a* and the "alternative component ID" 21*b* indicate identification information items of the master component and the alternative component, respectively. FIG. 3 illustrates an example in which a master component having a component ID of "A1" and an alternative component having a component ID of "A2" belong to a common group. The "component ID" 19*d* of the mount data 19 described above indicates only the identification information related to the master component. When the alternative component is mounted on the substrate 12, the control unit 17 controls various mechanisms including the mounting head 11 by referring to the mount data 19 of the master component.

The setting data 22 is data indicating setting information related to the component supplied from each tape feeder 13 disposed in the component supplying unit 7, and includes a "feeder address No." 22*a* and a "component ID" 22*b* which are combined with each other. The "feeder address No." 22*a* indicates positional information related to each tape feeder 13.

Figure 4:
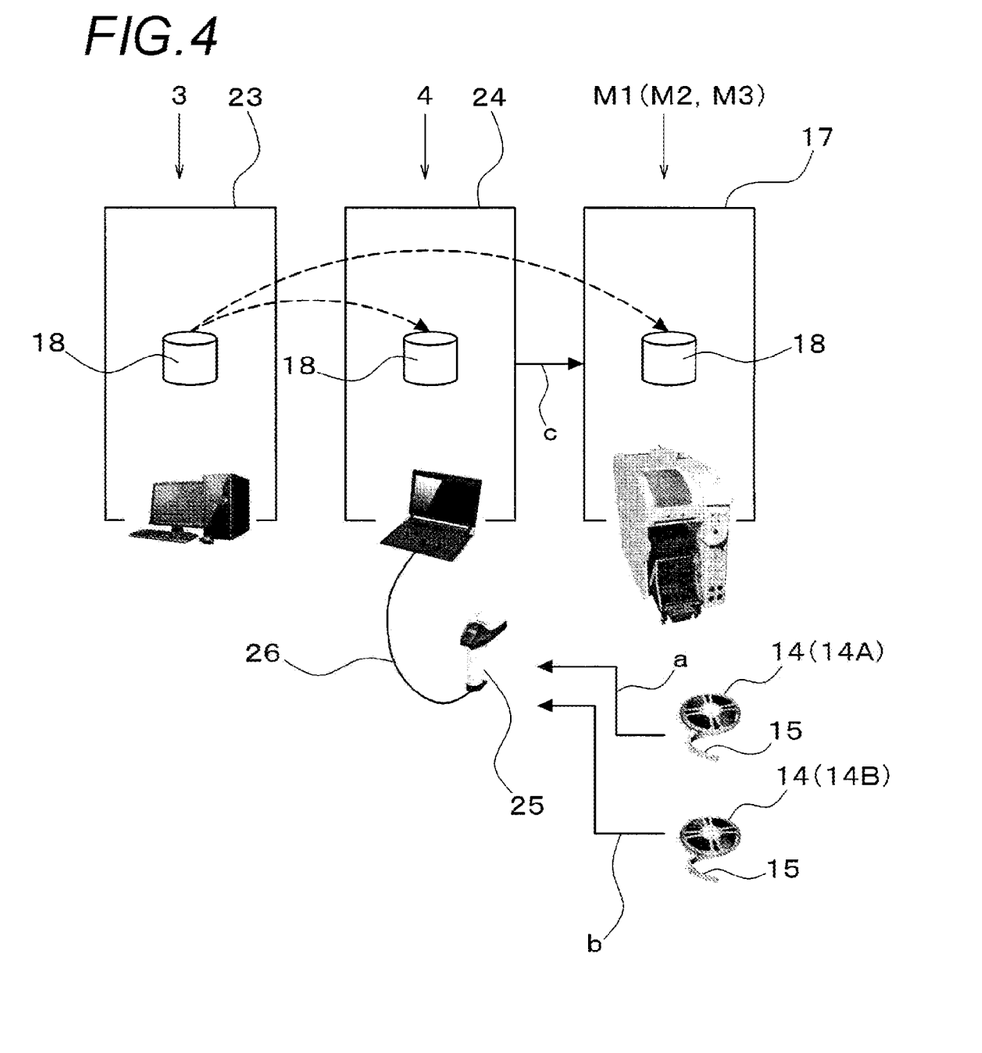
FIG. 4 is a diagram for describing a method of replenishing a component according to an embodiment of the present invention.

In FIG. 4, the data creating apparatus 3 includes a control unit 23, an input unit such as a keyboard, and a display such as a monitor. When an operator performs a predetermined input through the input unit, the control unit 23 creates various data such as the component data 20 according to the input details. The data creating apparatus 3 creates the component data 20 of the alternative component in response to a request from the component arranging operation supporting apparatus 4 (the detail will be described below). The control unit 23 has a storage region, and the production data 18 is stored in the storage region. The component data 20 created by the data creating apparatus 3 is stored in the storage region, as a part of the production data 18.

The component arranging operation supporting apparatus 4 includes a control unit 24, and the barcode reader 25 functioning as an identification information acquiring unit. The control unit 24 and the barcode reader 25 are connected so as to communicate with each other by a communication tool such as a communication cable 26. The communication tool may be wireless. The operator brings a read surface into contact with the barcode label 16 of the supply reel 14, and thus, the barcode reader 25 reads the component ID of the component held by the carrier tape 15 which is accommodated so as to be wound around the supply reel 14. Thus, the control unit 23 can acquire the component ID. As stated above, the barcode reader 25 acquires the identification information related to the component given to the component supply member. The acquisition of the component ID is not limited to the aforementioned method. For example, the input unit such as a keyboard may be provided in the component arranging operation supporting apparatus 4, and the operator may input the component ID through the input unit.

The control unit 24 has a storage region, and the production data 18 received from the data creating apparatus 3 is stored in the storage region. The control unit 24 has a function of performing a "component comparing process" and an "alternative component registering process", to be described below, by using the component ID acquired by the barcode reader 25.

The "component comparing process" refers to an original processing function of the component arranging operation supporting apparatus 4 and a function of notifying the erroneous setting of a replenishment supply reel 14 that is newly set. The component comparing process according to the present embodiment compares identification information related to the supply reel 14 that has already been set to the tape feeder 13 with a component ID of the replenishment supply reel 14 that is newly set. The comparison condition of the component is primarily divided into two patterns. The first pattern is a comparison between the master components. Specifically, the control unit 24 determines whether or not the component IDs acquired from two supply reels 14 match each other. The control unit 24 determines a comparison to be OK when the component IDs match, and determines a comparison to be NG when the component IDs do not match.

The second pattern is a comparison between the master component and the alternative component. Specifically, the control unit 24 determines whether or not the component IDs of the master component and the alternative component acquired from two supply reels 14 belong to the common group by referring to the component group data 21. The control unit 24 determines a comparison to be OK when the two component IDs belong to the common group, and determines a comparison to be NG when the two component IDs do not belong to the common group. It is possible to prevent the erroneous setting of the supply reel 14 by performing the component comparing process. As mentioned above, the component arranging operation supporting apparatus 4 checks whether or not the component disposed in a predetermined position in the component supplying unit is a component to be disposed in the predetermined position based on the identification information of the component acquired by the identification information acquiring unit.

The "alternative component registering process" refers to a process for registering the alternative component with the component mounting system 1. In the present specification, the registering of the alternative component means that the component data 20 and the component group data 21 regarding the alternative component are created and these data items are added to the production data 18 stored in the data creating apparatus 3, the component arranging operation supporting apparatus 4 and the mounting machines M1 to M3. This process is performed when the alternative component is replenished due to a shortage of the master component in stock and also when the component data 20 and the component group data 21 regarding the alternative component are not created due to several reasons. More specifically, the control unit 24 transmits two component IDs acquired by the barcode reader 25 to the data creating apparatus 3. The control unit 24 requests the data creating apparatus 3 to create the component data 20 of the alternative component based on the two transmitted component IDs. That is, the control unit 24 includes a component data creation requesting unit that transmits the identification information related to the component acquired by the identification information acquiring unit and the identification information related to the alternative component that can be used as an alternative to the component to the data creating apparatus 3 and requests a creation of the component data 20 regarding the alternative component.

The component mounting system 1 according to the present embodiment has the configuration described above. Subsequently, a method of replenishing a component will be described with reference to FIG. 4. Hereinafter, it will be described that the supply reel in which the carrier tape 15 which holds the master component is accommodated so as to be wound therearound is referred to as a "supply reel 14A", and the supply reel in which the carrier tape 15 which holds the alternative component is accommodated so as to be wound therearound is referred to as a "supply reel 14B".

When the component mounting operation of mounting the master components supplied from the tape feeder 13 to which the supply reel 14A is set on the substrate 12 is performed, the control unit 17 checks the number of remaining master components held by the carrier tape 15 (ST1: component remaining number checking process). When the number of remaining master components is equal to or less than a predetermined number, the control unit 17 notifies that the number of remaining master components is equal to or less than the predetermined number (a notice of a shortage of the component) by using a notification tool such as a lamp provided at a signal tower or the tape feeder 13 (ST2: notification process).

Upon the reception of the aforementioned notification, the operator specifies the master component to be replenished through the monitor, and prepares the replenishment supply reel 14A. Here, when the master component is not in stock, the operator prepares the supply reel 14B that accommodates the alternative components. In the present example, the supply reel 14B will be described as a replenishing target.

Subsequently, the component ID is acquired by the component arranging operation supporting apparatus 4 (ST3: identification information acquiring process). That is, the barcode reader 25 reads the component ID of the master component from the barcode label 16 of the supply reel 14A that has already been set to the tape feeder 13 (arrow a). Similarly, the barcode reader 25 reads the component ID of the alternative component from the barcode label 16 of the supply reel 14B (arrow b).

Thereafter, the control unit 24 compares the components based on the two acquired component IDs (ST4: component comparing process). That is, the control unit 24 compares the components based on whether or not the component IDs of the master component and the alternative component belong to the common group by referring to the component group data 21.

Subsequently, the control unit 24 notifies the operator of the comparison result through the monitor or the like (ST5: first comparison result notifying process). When the comparison OK is received, the operator sets the supply reel 14B to the tape feeder 13. As examples of this operation method, there is a tape splicing method of connecting ends of two carrier tapes 15 through a tape member or a splicing-less method of additionally replenishing a new carrier tape 15 without connection.

After the comparison result is received, the control unit 24 determines whether or not the input indicating that the component has been replenished has been received (ST6: input determination process). This determination is performed based on whether or not the operator operates several buttons provided on the tape feeder 13 or the mounting machines M1 to M3. When the operator operates the buttons, the control unit 24 determines that the component has been replenished. The component has been replenished by performing the processes described above.

When the comparison NG is received in the operation (ST5), the operator has the following choices. The first choice is to restart the process from the operation (ST3). This is because there is a possibility that the barcode label 16 of the supply reel 14A attached to a different tape feeder 13 will be erroneously read. The second choice is to restart the process from the operation (ST3) by checking whether or not the supply reel 14B is the correct supply reel. This is because there is a possibility that the supply reel of the component that can be used as an alternative will be erroneously prepared.

The third choice is to register the alternative component in the component mounting system 1. That is, although an error does not occur in the supply reel 14A that reads the component ID or the supply reel 14B prepared by the operator, the alternative component accommodated in the supply reel 14B may not be previously registered in the component mounting system 1, that is, the component data 20 and the component group data 21 regarding the alternative component may not be created. In this case, the component arranging operation supporting apparatus 4 determines as the comparison NG in spite of the fact that the alternative component can be used as an alternative to the master component. In such a case, the operator can register the alternative component in the component mounting system 1 by performing the alternative component registering process by the component arranging operation supporting apparatus 4. A method of registering the alternative component will be described below.

When the comparison result is the comparison OK in the component comparing process (ST4) described above, the control unit 24 notifies the mounting machines M1 to M3 of the comparison OK (arrow c shown in FIG. 4) (ST6: second comparison result notifying process). When the alternative component is replenished as in the present example, the control unit 24 notifies that the mounting target has been changed to the alternative component from the master component.

Next, the operations of the mounting machines M1 to M3 after the component is replenished will be briefly described. When the component mounting operation is repeatedly performed, the control unit 17 detects that the carrier tape 15 has been switched. When the component is replenished by the tape splicing method, the control unit 17 determines that the carrier tape 15 has been switched by detecting the splice of the carrier tape 15. When the component is replenished by the splicing-less method, the control unit 17 determines that the carrier tape 15 has been switched when the carrier tape 15 after the replenishment has been detected.

Subsequently, the control unit 17 checks whether or not the notification that the component is changed to the alternative component has been received from the component arranging operation supporting apparatus 4. When the notification has not been received, the mounting machines M1 to M3 continue the component mounting operation using the master component as a target based on the component data 20 specified by the "component ID" 19d of the mount data 19. Meanwhile, when the notification has been received, the mounting machines M1 to M3 perform the component mounting operation using the alternative component as a target based on the component data 20 specified by the component ID of the alternative component.

Figure 5:
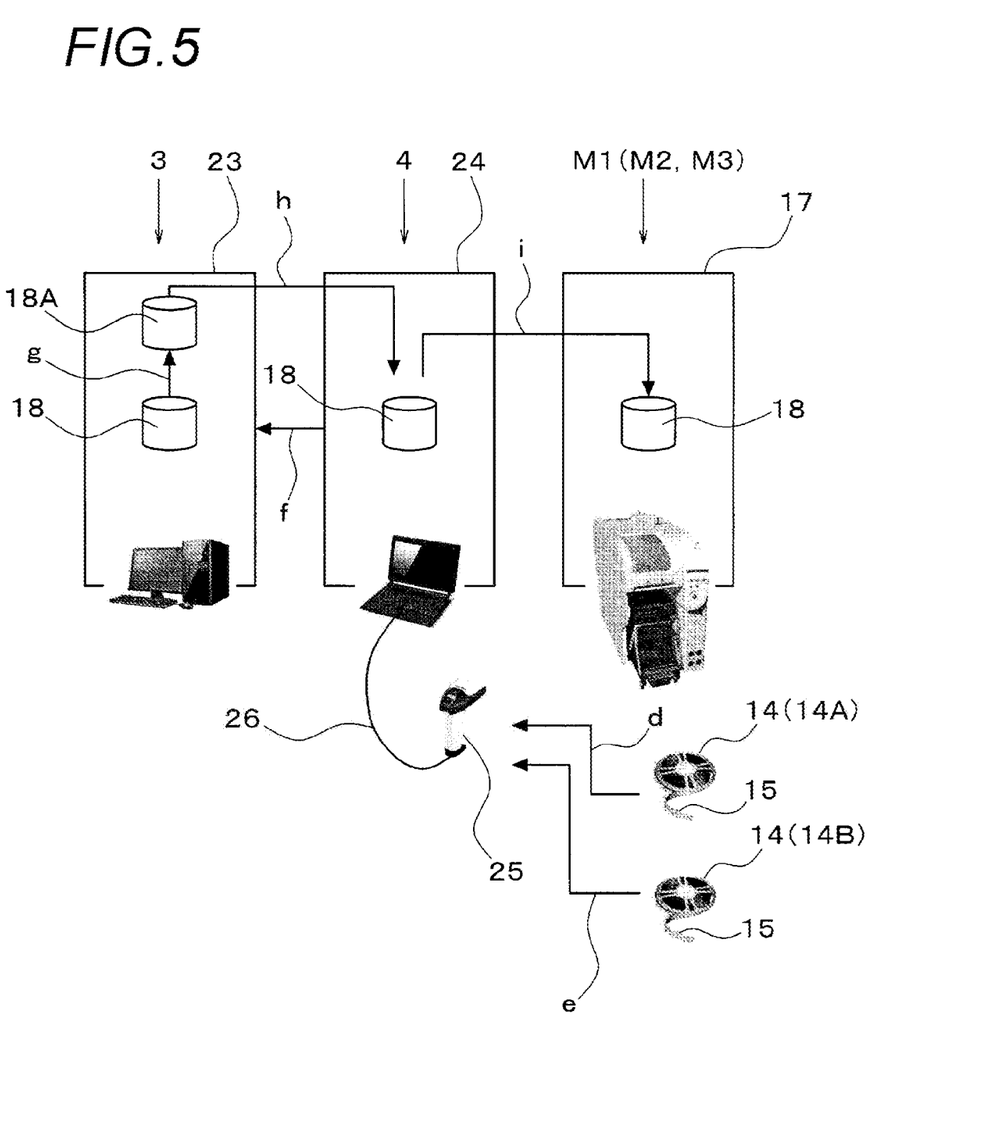
FIG. 5 is a diagram for describing a method of registering an alternative component according to an embodiment of the present invention.

Next, a method of registering the alternative component will be described with reference to FIG. 5. The process, to be described below, is performed after the operator switches the function of the component arranging operation supporting apparatus 4 from the component comparing process to the alternative component registering process. First, the component arranging operation supporting apparatus 4 acquires the component IDs from the supply reels 14A and 14B (ST11: identification information acquiring process). That is, the barcode reader 25 reads the component ID of the master component from the barcode label 16 of the supply reel 14A that has already been set to the tape feeder 13

(arrow d). Similarly, the barcode reader 25 reads a component ID of an alternative component which has not been registered from the barcode label 16 of the supply reel 14B (arrow e). The two read component IDs are transmitted to the control unit 24. That is, in this process (ST11), the identification information related to the component (master component) and the identification information related to the alternative component that can be used as an alternative to the corresponding component are acquired by the identification information acquiring unit.

Subsequently, the control unit 24 transmits the component IDs of the master component and the alternative component to the data creating apparatus 3 (arrow f), and requests the creation of the component data 20 regarding the alternative component (ST12: component data creation requesting process). That is, in this process (ST12), the control unit 24 transmits the two identification information items of the master component and the alternative component acquired by the identification information acquiring unit to the data creating apparatus 3 and requests the creation of the component data 20 regarding the alternative component.

Thereafter, when receiving the aforementioned request from the control unit 24 (a component data creation requesting unit), the data creating apparatus 3 creates the component data 20 of the alternative component based on the two identification information items of the master component and the alternative component received from the component arranging operation supporting apparatus 4 (ST13: component data creating process). Specifically, the control unit 23 initially creates update production data 18A in the storage region. That is, the control unit 23 creates the update production data 18A by copying the production data 18 that is currently stored (arrow g).

Subsequently, the control unit 23 performs a process of creating the component data 20 regarding the alternative component by copying the component data 20 of the master component and adding the created data to the update production data 18A. One reason that the component data 20 of the master component is copied is because it is considered that a special problem in mounting quality does not occur even though the control parameter of the master component is applied to the alternative component since a difference in size between the alternative component and the master component is slight in many cases. Another reason is because the labor of a person that initially creates the component data 20 is rendered unnecessary. In other words, the reason is because the creation of the component data 20 of the alternative component by the data creating apparatus 3 is automated.

Thus, it is possible to rapidly and simply create the component data 20 regarding the alternative component at the production site by omitting the manual input operation of the control parameter by the operator. The operations (ST11) to (ST13) described above correspond to the method of creating the component data 20.

Next, the control unit 23 performs a process of creating the component group data 21 obtained by combining the alternative component which is a creating target of the component data 20 and the master component corresponding to the alternative component and adding the created data to the update production data 18A (ST14: component group data creating process).

Subsequently, the control unit 23 transmits the update production data 18A to the component arranging operation supporting apparatus 4 (arrow h) (ST16: first data transmitting process). The control unit 24 of the component arranging operation supporting apparatus 4 updates the production data 18 within the storage region based on the received update production data 18A (ST17: second data updating process). Specifically, the control unit 24 adds a difference between the production data 18 and the update production data 18A, that is, the component data 20 and the component group data 21 regarding the alternative component to the production data 18.

The control unit 24 transmits the updated production data 18 to the mounting machines M1 to M3 (arrow i) (ST18: second data transmitting process). The update production data 18A may be transmitted from the data creating apparatus 3 to the mounting machines M1 to M3. Thereafter, the control unit 17 of each of the mounting machines M1 to M3 updates the production data 18 by adding the component data 20 and the component group data 21 regarding the alternative component to the production data 18 within the storage region (ST19: third data updating process). By performing the above processes, the registration of the alternative component with the component mounting system 1 is finished. Thus, the alternative component that has not been registered in the component arranging operation supporting apparatus 4 can be compared, and the component mounting operation using the alternative component that has not been registered in the mounting machines M1 to M3 can be performed.

While the processes from (ST12) to (ST19) are performed, the component arranging operation supporting apparatus 4 notifies that the registration process of the alternative component is being performed by displaying "during registration process of alternative component" on an accessory monitor to the operator, and notifies that the registration of the alternative component has been completed to the operator by displaying "registration is completed" when the process (ST19) is completed. The operator who has confirmed the notification returns the function of the component arranging operation supporting apparatus 4 from the alternative component registering process to the component comparing process, and performs the component comparison using the component arranging operation supporting apparatus 4 by performing the identification information acquiring process of (ST3).

As described above, according to the present embodiment, it is possible to rapidly and simply create the component data 20 regarding the alternative component at the production site. Moreover, it is possible to omit the labor and the effort of the operator in creating the component data 20.

According to the present invention, it is possible to rapidly and simply create component data regarding the alternative component at a production site, and it is useful in the field of mounting electronic components.

What is claimed is:

1. A component mounting system comprising:
a component mounting apparatus which mounts components supplied from a component supply member disposed in a component supplying unit on a substrate;
a data creating apparatus which creates component data, which is a control parameter set for mounting the component on the substrate by the component mounting apparatus, for each component; and
a component arranging operation supporting apparatus which includes an identification information acquiring unit that acquires component identification information given to the component supplying member, and a control unit which checks whether or not the component disposed in a predetermined position in the component supplying unit is a component to be disposed in the predetermined position based on the component identification information acquired by the identification information acquiring unit, wherein the control unit of the component arranging operation supporting apparatus includes a component data creation requesting unit that transmits the component identification information acquired by the identification information acquiring unit and identification information related to an alternative component that is used as an alternative to the component to the data creating apparatus and performs a request for a creation of component data regarding the alternative component, and the data creating apparatus receives the request from the component data creation requesting unit and creates the component data regarding the alternative component by copying the component data regarding the component that is replaced with the alternative component, wherein the component mounting apparatus is configured to mount the alternative component supplied from the component supply member to the substrate based on the component data regarding the alternative component created by the data creating apparatus.

2. A method of a component mounting system that includes a component mounting apparatus which mounts components supplied from a component supply member disposed in a component supplying unit on a substrate, a data creating apparatus which creates component data, which is a control parameter set for mounting the component on the substrate by the component mounting apparatus, for each component, and a component arranging operation supporting apparatus which includes an identification information acquiring unit that acquires component identification information given to the component supplying member and a control unit that checks whether or not the component disposed in a predetermined position in the component supplying unit is a component to be disposed in the predetermined position based on the component identification information acquired by the identification information acquiring unit, the method comprising:

causing the identification information acquiring unit to acquire identification information related to the component and identification information related to an alternative component that is used as an alternative to the component;

causing the component arranging operation supporting apparatus to transmit both of the identification information related to the component and the alternative component acquired by the identification information acquiring unit to the data creating apparatus;

causing the data creating apparatus to create component data regarding the alternative component based on both of the identification information related to the component and the alternative component received from the component arranging operation supporting apparatus; and causing the component mounting apparatus to mount the alternative component supplied from the component supply member to the substrate based on the created component data regarding the alternative component, wherein the component data regarding the alternative component is created by copying the component data regarding the component which is replaced with the alternative component.

\* \* \* \* \*